US010715702B1

(12) United States Patent
Zhao et al.

(10) Patent No.: US 10,715,702 B1
(45) Date of Patent: Jul. 14, 2020

(54) METHOD OF AND CIRCUIT FOR PREDISTORTION FOR A CABLE TV AMPLIFIER

(71) Applicant: Xilinx, Inc., San Jose, CA (US)

(72) Inventors: Hongzhi Zhao, Los Gatos, CA (US); Christopher H. Dick, San Jose, CA (US); Xiaohan Chen, Sunnyvale, CA (US); Hemang M. Parekh, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/351,158

(22) Filed: Mar. 12, 2019

(51) Int. Cl.
| | | |
|---|---|---|
| *H04L 25/49* | (2006.01) | |
| *H04L 25/03* | (2006.01) | |
| *H04N 5/21* | (2006.01) | |
| *H03F 1/32* | (2006.01) | |
| *H04N 5/00* | (2011.01) | |

(52) U.S. Cl.
CPC ............. *H04N 5/21* (2013.01); *H03F 1/32* (2013.01); *H03F 1/3241* (2013.01); *H04L 25/03* (2013.01); *H04L 25/49* (2013.01); *H04N 5/00* (2013.01)

(58) Field of Classification Search
CPC ........... H04L 25/03; H04L 25/49; H04K 1/02; H04N 5/38; H04N 5/21; H03F 1/32; H03F 1/3241; H04B 1/04; H04B 2001/0408
USPC .................................. 375/297, 229; 348/608
See application file for complete search history.

(56) References Cited

U.S. PATENT DOCUMENTS

| | | | | |
|---|---|---|---|---|
| 5,252,930 A * | 10/1993 | Blauvelt | ............... | H03F 1/3252 327/100 |
| 7,822,146 B2 * | 10/2010 | Copeland | ............. | H03F 1/3241 330/149 |
| 8,032,336 B2 * | 10/2011 | Batruni | ................ | H03F 1/3247 702/179 |
| 8,131,661 B2 * | 3/2012 | Ganai | .................... | G06F 17/11 706/45 |
| 8,260,144 B2 * | 9/2012 | Gupta | ................. | H04L 27/2096 398/115 |
| 8,989,250 B1 * | 3/2015 | Warner | ................... | H04L 27/01 375/229 |
| 9,160,457 B2 * | 10/2015 | Mysore | ................ | H04B 10/503 |
| 9,166,840 B2 * | 10/2015 | Bai | ........................ | H03M 7/30 |
| 9,628,119 B2 * | 4/2017 | Gal | ...................... | H04B 1/0475 |
| 10,411,656 B1 * | 9/2019 | Dick | ........................ | H04N 5/38 |
| 2010/0111221 A1 * | 5/2010 | Nash | .................... | H04L 27/364 375/296 |
| 2019/0068429 A1 * | 2/2019 | Sagi | ..................... | H04B 1/0475 |

* cited by examiner

*Primary Examiner* — Trang U Tran
(74) *Attorney, Agent, or Firm* — Crawford Maunu PLLC

(57) ABSTRACT

A digital predistortion (DPD) system includes an input configured to receive a DPD input signal. In some examples, a non-linear datapath is coupled to the input, where the non-linear datapath is configured to add a non-linear mirror image component to the DPD input signal to provide a non-linear signal that is used to generate a first predistortion signal. In some embodiments, a linear datapath is coupled to the input in parallel with the non-linear datapath to generate a second predistortion signal. A first combiner is configured to combine the first predistortion signal and the second predistortion signal to generate a DPD output signal.

20 Claims, 12 Drawing Sheets

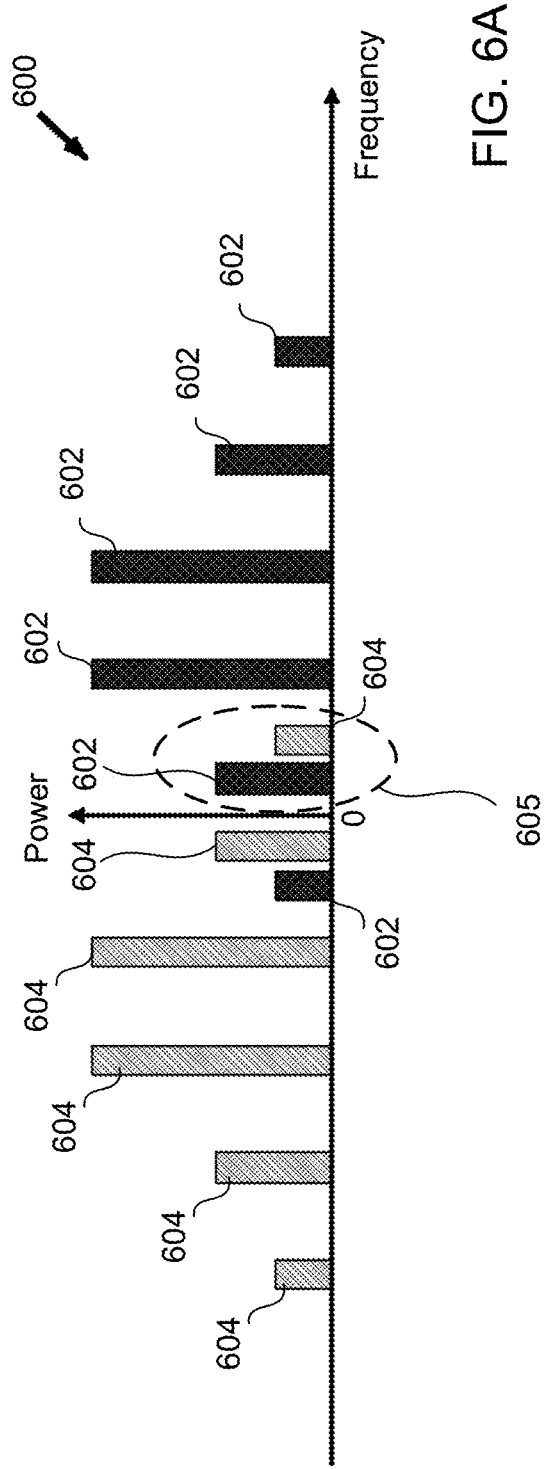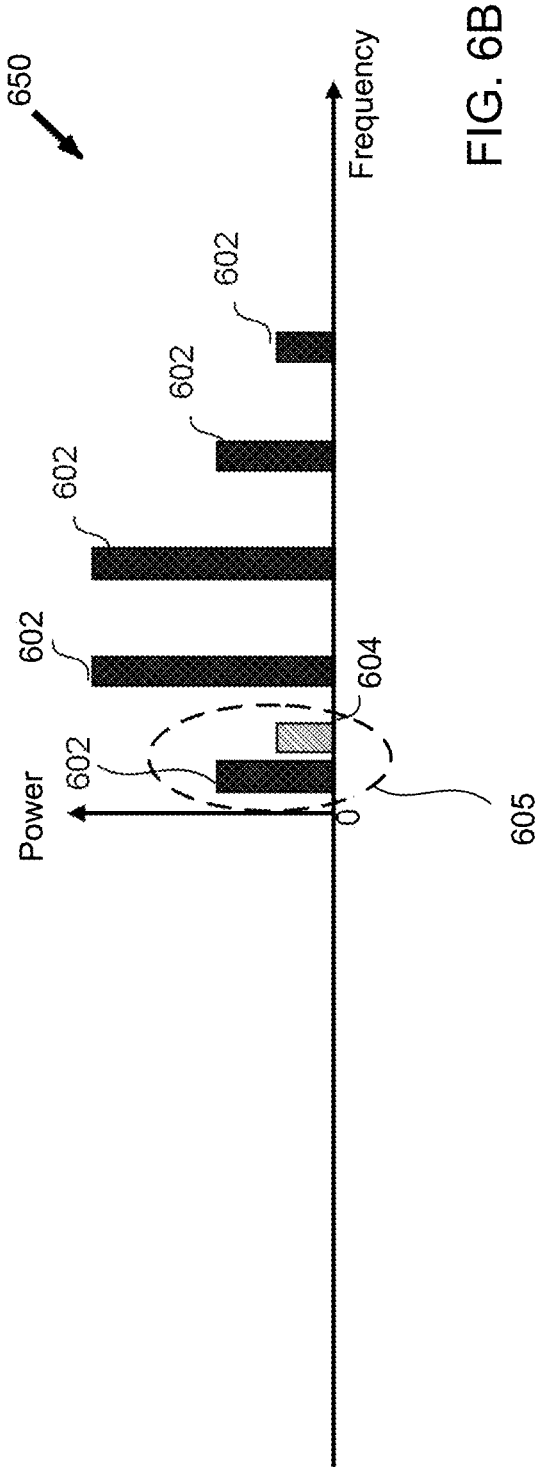

| CATV Amplifier Type I: Output Power 76.8dBmV/75Ω, DC Supply 34V/380mA, 4K QAM | | |
|---|---|---|
| | No DPD | DPD w/o Mirror Image Datapath | DPD with Mirror Image Datapath |
| MER (204MHz Carrier) | 35.15 dB | 38.69 dB | 41.35 dB |
| CATV Amplifier Type II: Output Power 76.8dBmV/75Ω, DC Supply 34V/400mA, 4K QAM | | |
| | No DPD | DPD w/o Mirror Image Datapath | DPD with Mirror Image Datapath |
| MER (204MHz Carrier) | 36.32 dB | 38.79 dB | 41.54 dB |

1002 (Type I rows), 1004 (Type II rows)

METHOD OF AND CIRCUIT FOR PREDISTORTION FOR A CABLE TV AMPLIFIER

TECHNICAL FIELD

Examples of the present disclosure generally relate to integrated circuits ("ICs") and, in particular, to an embodiment related to performing digital predistortion for cable TV (CATV) amplifiers.

BACKGROUND

To meet the demands for higher data rates of internet, telephony, and video services, the cable industry is deploying a new high data rate and wideband Remote PHY node based on the new Data Over Cable Service Interface Specification (DOCSIS) 3.1 standards. DOCSIS 3.1 supports 4096 quadrature amplitude modulation (QAM) and uses orthogonal frequency division multiplexing (OFDM). As such, the transmitted signal quality requirement for DOCSIS 3.1 is much higher than for the current standard DOCSIS 3.0. Due to the more sophisticated functions associated with DOCSIS 3.1, cable television (CATV) amplifiers may operate in a non-linear region. The non-linear effects of a CATV amplifier will significantly degrade a transmitted signal quality. In addition, the new components that provide the high data rates and more sophisticated functions of DOCSIS 3.1 will themselves consume power. However, since the power supply to each node (e.g., each remote PHY node) is fixed, the power consumption of other components (e.g., such as the CATV amplifiers) should be reduced. Thus, while it is desirable to provide the advanced performance of DOCSIS 3.1, it has been challenging to do so while providing an improved transmitted signal quality and a reduced power consumption of other components (e.g., such as CATV amplifiers).

Accordingly, there is a need for improved methods and circuits for predistortion for CATV amplifiers.

SUMMARY

In some embodiments in accordance with the present disclosure, a digital predistortion (DPD) system includes an input configured to receive a DPD input signal. In some examples, a first non-linear datapath is coupled to the input, where the first non-linear datapath is configured to add a non-linear mirror image component to the DPD input signal to provide a first non-linear signal that is used to generate a first predistortion signal. In some embodiments, a linear datapath is coupled to the input in parallel with the first non-linear datapath to generate a second predistortion signal. A first combiner is configured to combine the first predistortion signal and the second predistortion signal to generate a DPD output signal.

In some embodiments, the DPD system further includes a second non-linear datapath coupled to the input, where the second non-linear datapath is configured to add a non-linear component to the DPD input signal to generate a second non-linear signal. A second combiner is configured to combine the first non-linear signal and the second non-linear signal to generate the first predistortion signal.

In some embodiments, the DPD system further includes a conjugation block coupled to the input and configured to conjugate the DPD input signal to provide a conjugate DPD input signal at an output of the conjugation block, where the first non-linear datapath is coupled to the output of the conjugation block and configured to receive the conjugate DPD input signal.

In some embodiments, the non-linear mirror image component includes a spectrum cross overlap component.

In some embodiments, the non-linear mirror image component includes a baseband non-linear mirror image component.

In some embodiments, the non-linear component includes a baseband non-linear component and a harmonic non-linear component.

In some embodiments, the DPD input signal includes a first complex signal, and the DPD output signal includes a second complex signal including the non-linear mirror image component.

In some embodiments, the second non-linear datapath includes a plurality of parallel datapath elements each coupled to the input, where each of the plurality of parallel datapath elements is configured to add a different inverse non-linear component to the DPD input signal corresponding to a non-linear component of an amplifier, and where a third combiner is configured to combine an output of each of the plurality of parallel datapath elements to generate the second non-linear signal.

In some embodiments, the DPD system further includes a digital tilt filter configured to model an analog tilt filter, where a digital tilt filter input is coupled to the input, and where a digital tilt filter output is coupled to the first non-linear datapath.

In some embodiments, the DPD system further includes a digital tilt equalizer configured to model an inverse of an analog tilt filter, where a digital tilt equalizer input is configured to receive the first predistortion signal, and where the first combiner is configured to combine a digital tilt equalizer output to the second predistortion signal to generate the DPD output signal.

In some embodiments, the DPD system further includes a single side band Hilbert filter, where a single side band Hilbert filter input is configured to receive the first predistortion signal, and where a single side band Hilbert filter output is coupled to the digital tilt equalizer input.

In some embodiments, the DPD output signal is coupled to an amplifier input to generate an amplified output signal, and the DPD output signal is configured to compensate for a plurality of non-linear components, including non-linear mirror image components, of the amplifier.

In some embodiments in accordance with the present disclosure, digital front-end (DFE) system configured to perform a digital predistortion (DPD) process includes a digital upconverter (DUC) configured to receive and translate a baseband data input signal to generate a composite signal. In some examples, the DFE system also includes a DPD system configured to receive the composite signal at a DPD input and perform the DPD process to the composite signal, where the DPD input is coupled to a first non-linear datapath, where the first non-linear datapath is configured to add a non-linear mirror image component to the composite signal to generate a DPD output signal, and where the DPD output signal is coupled to an amplifier. In some embodiments, the DPD output signal is configured to compensate for a non-linear mirror image component of the amplifier.

In some embodiments, the DPD input is further coupled to a second non-linear datapath, where the second non-linear datapath is configured to add a non-linear component to the composite signal to generate the DPD output signal.

In some embodiments, the DFE system further includes a conjugation block coupled to the DPD input and configured to conjugate the composite signal to provide a conjugate composite signal at an output of the conjugation block, where the first non-linear datapath is coupled to the output of the conjugation block and configured to receive the conjugate composite signal.

In some embodiments, the non-linear mirror image component includes a baseband non-linear mirror image component, where the non-linear component includes a baseband non-linear component and a harmonic non-linear component.

In some embodiments in accordance with the present disclosure, a method includes receiving a DPD input signal at an input of a digital predistortion (DPD) system. In some embodiments, the method further includes receiving the DPD input signal at a first non-linear datapath coupled to the input of the DPD system and adding, by the first non-linear datapath, a non-linear mirror image component to the DPD input signal to provide a first non-linear signal that is used to generate a first predistortion signal. The method further includes receiving the DPD input signal at a linear datapath coupled to the input in parallel with the first non-linear datapath to generate a second predistortion signal. In some examples, the method further includes combining, by a first combiner, the first predistortion signal and the second predistortion signal to generate a DPD output signal.

In some embodiments, the method further includes receiving the DPD input signal at a second non-linear datapath coupled to the input of the DPD system and adding, by the second non-linear datapath, a non-linear component to the DPD input signal to provide a second non-linear signal. In some examples, the method includes combining, by a second combiner, the first non-linear signal and the second non-linear signal to generate the first predistortion signal.

In some embodiments, the non-linear mirror image component includes a baseband non-linear mirror image component, where the non-linear component includes a baseband non-linear component and a harmonic non-linear component.

In some embodiments, the method further includes providing the DPD output signal to an amplifier input to generate an amplified output signal, where the DPD output signal is configured to compensate for a plurality of non-linear components, including non-linear mirror image components, of the amplifier.

Other aspects and features will be evident from reading the following detailed description and accompanying drawings.

BRIEF DESCRIPTION OF THE DRAWINGS

FIG. 6A illustrates a power spectrum exhibiting a spectrum cross overlap, according to some embodiments.

FIG. 6B illustrates the power spectrum of FIG. 6A after processing by a single side band filter, according to some embodiments.

FIG. 10 provides a table including modulation error ratio (MER) data for a CATV amplifier showing the effect of applying the corrections provided by the DPD system on the MER data, according to some embodiments.

DETAILED DESCRIPTION

Figure 1:
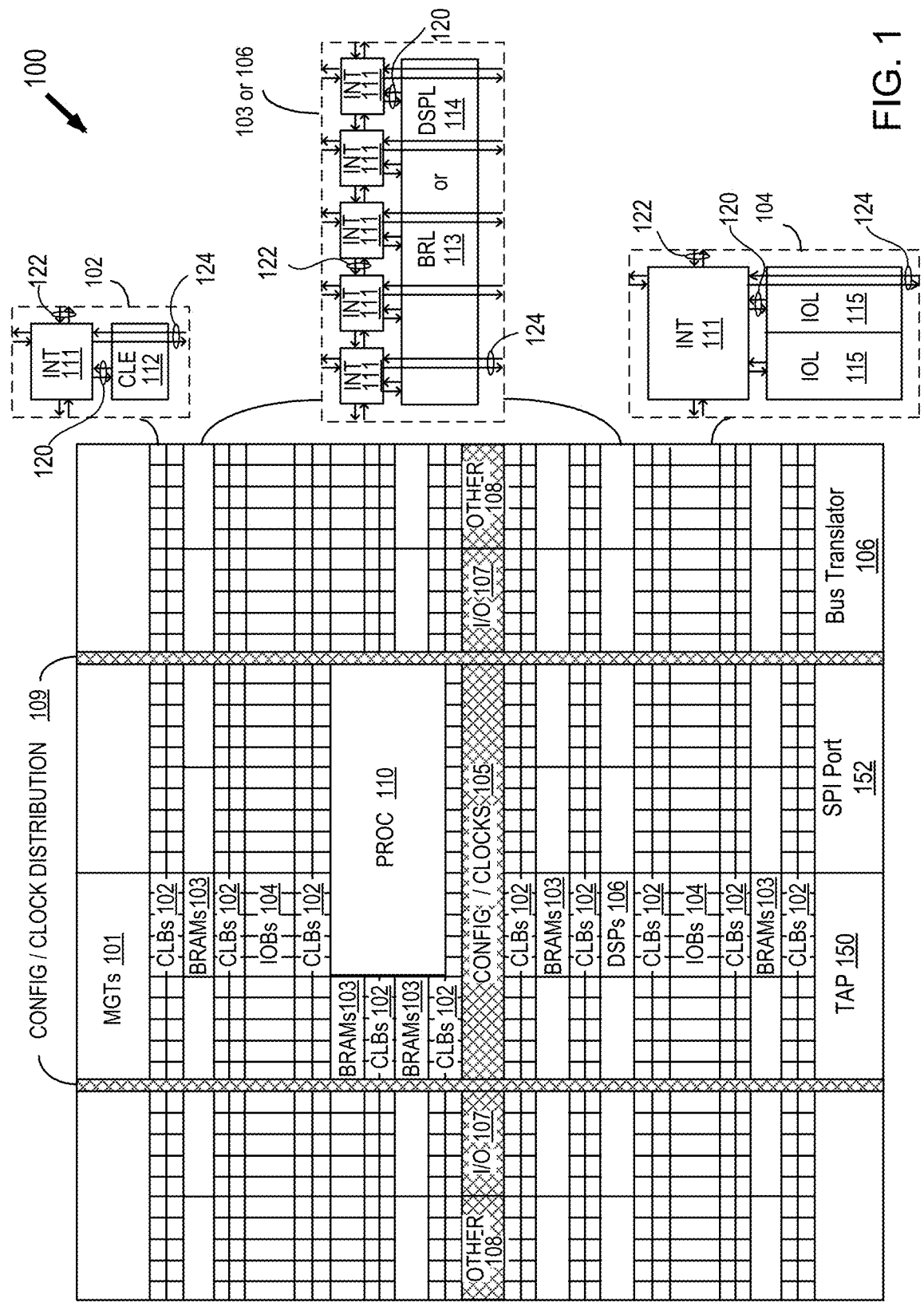
FIG. 1 is a block diagram illustrating an exemplary architecture for an IC, according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding.

As discussed above, the cable industry is deploying a new high data rate and wideband Remote PHY node based on the DOCSIS 3.1 standards to meet the demands for higher data rates of internet, telephony, and video services. DOCSIS 3.1 supports 4096 (4K) quadrature amplitude modulation (QAM) and uses orthogonal frequency division multiplexing (OFDM). As such, the transmitted signal quality requirement for DOCSIS 3.1 is much higher than for the current standard DOCSIS 3.0. Due to the more sophisticated functions associated with DOCSIS 3.1, cable television (CATV) amplifiers may operate in a non-linear region. The non-linear effects of a CATV amplifier will significantly degrade a transmitted signal quality. In addition, the new components that provide the high data rates and more sophisticated functions of DOCSIS 3.1 will themselves consume power. However, since the power supply to each node (e.g., each remote PHY node) is fixed, the power consumption of other components (e.g., such as the CATV amplifiers) should be reduced. Thus, while it is desirable to provide the advanced performance of DOCSIS 3.1, it has been challenging to do so while providing an improved transmitted signal quality and a reduced power consumption of other components (e.g., such as CATV amplifiers).

In at least some existing techniques, a tilt equalizer (analog tilt filter) with deep attenuation up to 21 dB over the cable spectrum of a DOCSIS 3.1 transmission system (e.g., from about 100 MHz to about 1.2 GHz) is implemented in an analog transmit path to compensate for coaxial cable loss (e.g., from CATV amplifier to cable modem). However, a DOCSIS 3.1 waveform using 4K QAM OFDM modulation shows a high peak-to-average power ratio (PAPR) as compared to the current DOCSIS 3.0 standard. As such, for the same RMS power output of a CATV amplifier in DOCSIS 3.0, the peak of a DOCSIS 3.1 waveform will be in the non-linear region of the CATV amplifier. Thus, transmitted signal quality is degraded. Digital predistortion (DPD) can be used to improve the signal quality for a CATV amplifier, for example, by causing the CATV to operate in a higher efficiency region. DPD has been used for wireless communication technologies where signal bandwidth is much more narrow than that used for cable communication technologies. Further, in wireless communications, harmonics of the non-linear effects of the wireless components do not fall into the signal bandwidth. As such, DPD for wireless communications need only model the non-linear components projected around the baseband frequency. However, for cable applications, harmonics of the non-linear effects of the CATV amplifier signal fall into the signal bandwidth. Therefore, DPD implementations for cable applications should model the harmonic components of the non-linear effects for the CATV amplifier. Separately, the tilt equalizer with deep attenuation cannot be implemented in the digital domain, and a digital tilt equalizer implementation will degrade the transmitting waveform quality of lower frequency carriers due to the finite digital resolution of a digital-to-analog converter (DAC).

In addition, a CATV amplifier for DOCSIS 3.1 should run at a high transmit power and high efficiency mode in order to meet the DC power consumption budget limit of the cable system. As noted above, DPD can be used to cause the CATV to operate in a higher efficiency region, for example, by compensating for non-linear effects of the CATV amplifier (e.g., harmonic components) in order to transmit high order modulation without errors. However, another non-linear component, referred to as a baseband non-linear mirror image, may fall into the low frequency spectrum of the transmitted signal and degrade the transmitted signal quality (e.g., by degrading the modulation error ratio (MER)). The baseband non-linear mirror image component is not considered in DPD for wireless communications because the wireless carrier frequencies are far away from DC (e.g., far away from the low frequency spectrum of the transmitted signal) and the transmit power is substantially the same for all carriers. For DOCSIS 3.1, which has a high MER specification of up to 41 dB for a 4K QAM signal, the baseband non-linear mirror image component should be considered. In particular, and because of the analog tilt filter in the analog transmit path, the transmit power is about 21 dB lower at lower frequencies (e.g., -100 MHz) as compared to the transmit power at higher frequencies (e.g., 1.2 GHz). In some cases, this may result in a more pronounced effect of the baseband non-linear mirror image component in the waveform of low frequency carriers as the CATV amplifier operates in the high efficiency mode. Thus, DPD implementations for cable applications which only model baseband and harmonic non-linear components of the CATV amplifier may not be able to achieve the high MER specification. For integrated circuit (IC) solutions, it has been discovered that DPD data paths, implemented within a digital front-end (DFE) chip, can provide a solution to modeling the baseband non-linear mirror image component, as well as baseband and harmonic components of the non-linear effects for the CATV amplifier and the deep attenuation over the transmitting spectrum in CATV amplifiers. Thus, embodiments of the present disclosure provide for improved transmitted signal quality, improved MER, and reduced power consumption of the CATV amplifiers.

With the above general understanding borne in mind, various embodiments for providing methods and circuits for predistortion for CATV amplifiers are generally described below. Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110. In some embodiments, the FPGA architecture 100 includes an RF data converter subsystem, which contains multiple radio frequency analog-to-digital converters (RF-ADCs) and multiple radio frequency digital-to-analog converters (RF-DACs). In various examples, the RF-ADCs and RF-DACs may be individually configured for real data or can be configured in pairs for real and imaginary I/Q data. In at least some examples, the FPGA architecture 100 may implement an RFSoC device.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An 10B 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the methods and circuits for predistortion for CATV amplifiers is not limited to the exemplary IC depicted in FIG. 1, and that ICs having other configurations, or other types of ICs, may also implement the methods and circuits for predistortion for CATV amplifiers.

Figure 2:
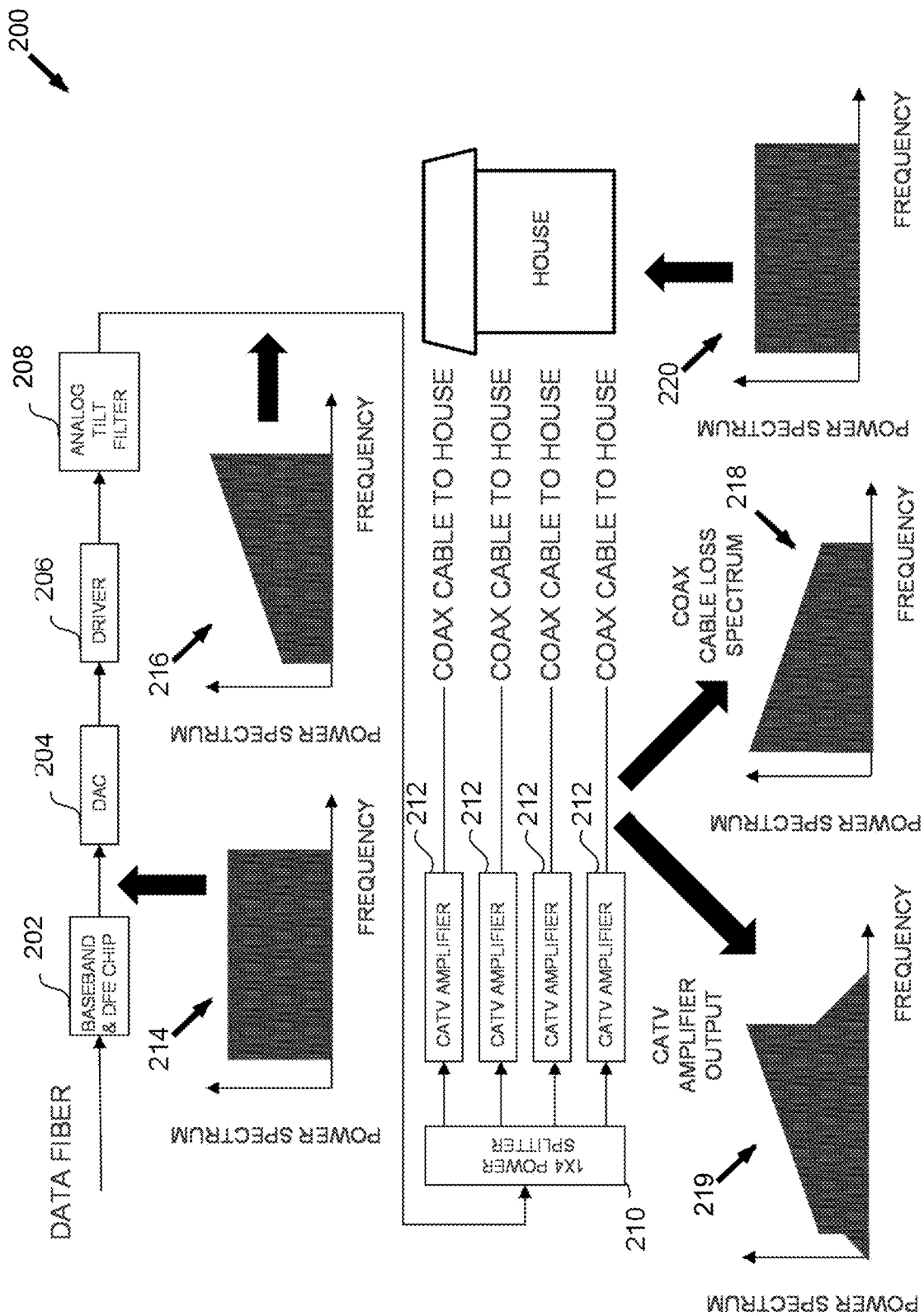
FIG. 2 is a schematic diagram of an exemplary cable network, in accordance with some embodiments.

With reference now to FIG. 2, illustrated therein is a cable network 200 that shows a signal path starting from a data fiber (e.g., which may include an optical fiber), through a remote node, and to an end user location (e.g., at a house). The cable network 200 may be part of a hybrid fiber-coaxial network, where a data fiber is run from a central headend to the remote node, and where coaxial cable is run from the remote node to the end user. In some examples, the remote node includes a remote PHY node based on the DOCSIS 3.1 standards. The remote PHY node, in some embodiments, may include a baseband and digital front-end (DFE) chip 202, a digital-to-analog converter (DAC) 204, a driver 206 (e.g., which may include an amplifier), an analog tilt filter 208, a power splitter 210, and CATV amplifiers 212. In various examples, the baseband and DFE chip 202 may be implemented as a single chip, or as separate chips including a baseband processor chip and a separate DFE chip. In some embodiments, the DAC 204 may be implemented as an RF DAC or an IF DAC, for example, depending on an input to the DAC 204. Additionally, in some embodiments, the baseband and DFE chip 202 and the DAC 204 may be implemented as a single chip (e.g., as in an RFSoC device). Moreover, one or more components of the remote PHY node may be implemented in a programmable logic device, such as the programmable logic device of FIG. 1. As shown in FIG. 2, the data fiber is connected as an input to the baseband and DFE chip 202, the output of the baseband and DFE chip 202 is connected as an input to the DAC 204. A power spectrum 214 (without a slope) provides an example of the shape of the signal at the output of the baseband and DFE chip 202. The output of the DAC 204 is connected as an input to the driver 206, and the output of the driver 206 is connected as an input to the analog tilt filter 208. For cable applications, the analog tilt filter 208 may be used to change a gain across the power spectrum of the signal. Stated another way, the analog tilt filter 208 is used to add a slope in the power levels of the signal across the power spectrum. A power spectrum 216 illustrates the slope (e.g., a positive slope in the present example) in the signal, as compared to the power spectrum 214, at the output of the analog tilt filter 208.

In some embodiments, the output of the analog tilt filter 208 is connected as an input to the power splitter 210. In the example of FIG. 2, the power splitter 210 includes a 1×4 power splitter having a single input and four outputs. However, in some embodiments, the power splitter 210 may include a 1×2 power splitter having a single input and two outputs, a cascade of 1×2 power splitters (e.g., to produce four outputs), or another type of power splitter. In the present example, each of the four outputs of the power splitter 210 is connected as an input to a CATV amplifier 212. The output of each of the CATV amplifiers 212 is then coupled to a coaxial cable which is further coupled to a cable modem at the end user location (e.g., at a house). In at least some embodiments, the cable network 200 implements a Node+0 architecture, which means there are no additional CATV amplifiers (beyond the CATV amplifiers 212 at the remote PHY node) along the coaxial cable path between the remote PHY node and the end user location. FIG. 2 further illustrates a power spectrum 218 showing a coaxial cable loss spectrum (e.g., with a negative slope), a power spectrum 219 showing an output signal of the CATV amplifiers 212, and a power spectrum 220 showing a power spectrum (without a slope) of a signal reaching the end user location. As previously discussed, the analog tilt filter 208 is used to compensate for coaxial cable loss (e.g., from the CATV amplifiers 212 to the cable modem at the end user location).

In at least some existing cable networks, CATV amplifiers operate in a linear region. This means that an amount of non-linearity at an output of a CATV amplifier is low enough that no additional signal processing is needed, and the signal at the output of the CATV amplifier may be sent directly on a coaxial cable to an end user location cable modem for demodulation and information transfer. However, with the transition to the more sophisticated functions and additional power-consuming components associated with DOCSIS 3.1, and because the power supply to each node (e.g., each remote PHY node) is fixed, it would be desirable to reduce the power consumption of other components such as the CATV amplifiers. Currently, CATV amplifiers are around 2-3% efficient, so for example, a single CATV amplifier with 20 Watts of input power would output around ½ Watt of output power. For four CATV amplifiers (e.g., as shown in FIG. 2), 100 Watts of input power would output around 2 Watts of output power. Thus, it is highly desirable to make CATV amplifiers more efficient.

At least one option that is being explored to make CATV amplifiers more efficient is to make the CATV amplifiers operate in a more non-linear region. However, doing so means that the signal at the output of the CATV amplifier may not be sent directly on a coaxial cable to an end user location without some sort of additional digital signal processing, as provided in accordance with embodiments of the present disclosure. For example, embodiments disclosed herein add functionality within the baseband and DFE chip 202, as discussed in more detail below, so that even if the CATV amplifiers operate in a non-linear region, the baseband and DFE chip 202 will be able to invert or change the signal such that the signal at the output of the CATV amplifier will still be linear and can be readily demodulated by a cable modem at the end user location. Stated another way, if a CATV amplifier has a non-linearity 'x', the functionality within the baseband and DFE chip 202 is configured to add inverse non-linearity '1/x' that will be cancelled out by the non-linearity 'x' of the CATV amplifier. As such, the signal at the output of the CATV amplifier is clean and linear. Generally, the process of adding in the non-linearity in advance (e.g., such as adding in the inverse non-linearity at the baseband and DFE chip 202) is called predistorting or predistortion. In the context of the baseband and DFE chip 202, and since distortion is added digitally, the predistortion may be referred to as digital predistortion (DPD). In accordance with various embodiments, the DPD process is performed with the knowledge of the type of non-linearity 'x' that a CATV amplifier has (e.g., such as baseband non-linear mirror image components, as well as baseband and harmonic non-linear components), so that the DPD process may add the proper inverse non-linearity '1/x'. Thus, by way of example, the inverse non-linearity added (e.g., by the baseband and DFE chip 202) may be used to cancel out the baseband non-linear mirror image component, as well as the baseband and harmonic non-linear components of the CATV amplifier. Moreover, the DPD process is performed with the knowledge of the signal chain between the baseband and DFE chip 202 and the CATV amplifiers 212, including any effects and/or distortions introduced by each of the DAC 204, the driver 206, and the analog tilt filter 208. In various embodiments, by the DPD process disclosed herein, CATV amplifier efficiency and MER are improved, and power consumption is reduced.

Figure 3:
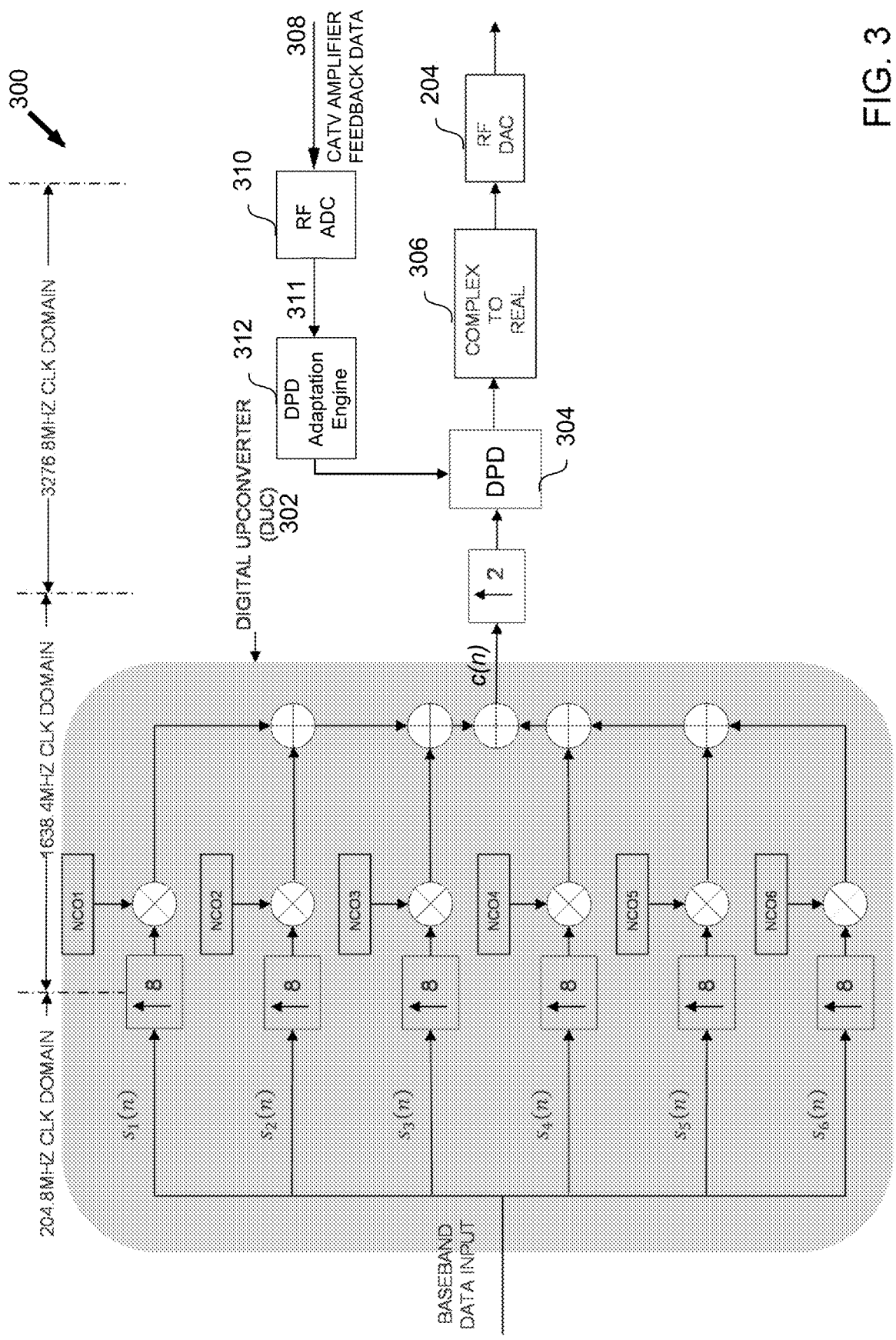
FIG. 3 is a schematic diagram of an exemplary digital front-end (DFE) system, in accordance with some embodiments.

In some embodiments, the functionality within the baseband and DFE chip 202 (configured to add the inverse non-linearity) may be implemented largely as DFE functionality, where a baseband output signal is provided as an input to the DFE chip. As such, and with reference now to FIG. 3, illustrated therein is a DFE system 300 that provides a DFE design configured to carry out one or more aspects of the present disclosure. In some embodiments, the DFE system 300 includes a digital upconverter (DUC) 302. In various examples, the DUC 302 is used to translate one or more channels of data from baseband to a passband signal comprising modulated carriers at a set of one or more specified radio or intermediate frequencies (RF or IF). By way of example, the DUC 302 achieves this by performing interpolation (e.g., to increase the sample rate), filtering (e.g., to provide spectral shaping and rejection of interpolation images), and mixing (e.g., to shift the signal spectrum to the desired carrier frequencies). Generally, the sample rate at the input to the DUC 302 is relatively low; for example, the symbol rate of a digital communications system, while the output is a much higher rate, for example the input sample rate to a DAC, which converts the digital samples to an analog waveform for further analog processing and frequency conversion.

As shown in the example of FIG. 3, a baseband data input is provided to the DUC 302. The baseband data input includes a plurality of different carriers represented as $s_1(n)$, $s_2(n)$, $s_3(n)$, $s_4(n)$, $s_5(n)$, and $s_6(n)$. In some embodiments, the sampling rate of the baseband data input is around 204.8 MHz, corresponding to the OFDM symbol clock. By way of example, the DUC 302 generates the plurality of different carriers (e.g., from the baseband data input) by initially performing interpolation of the baseband data input, which in the present example is used to increase the sampling rate by a factor of eight (8), and thereby transition from a first clock domain (e.g., a 204.8 MHz clock domain) to a second clock domain (e.g., a 1638.4 MHz clock domain). After the interpolation process, each of the plurality of different carriers is mixed with a signal from a numerically controlled oscillator (NCO), each NCO having a different frequency, to shift the frequency of each of the plurality of different carriers to a desired carrier frequency. For example, the carrier $s_1(n)$ is mixed with a first NCO (NCO1) having a first frequency, the carrier $s_2(n)$ is mixed with a second NCO (NCO2) having a second frequency, the carrier $s_3(n)$ is mixed with a third NCO (NCO3) having a third frequency, the carrier $s_4(n)$ is mixed with a fourth NCO (NCO4) having a fourth frequency, the carrier $s_5(n)$ is mixed with a fifth NCO (NCO5) having a fifth frequency, and the carrier $s_6(n)$ is mixed with a sixth NCO (NCO6) having a sixth frequency. After the mixing process, each of the plurality of different carriers are combined to form a composite signal $c(n)$. Thus, the composite signal $c(n)$ includes each of the plurality of different carriers mixed at different frequencies. In some embodiments, and as a result of the mixing process, the composite signal $c(n)$ may look substantially the same as the signal shown in FIG. 5A, where each of the plurality of different carriers are arranged side-by-side in frequency. In some cases, after generation of the composite signal $c(n)$, another interpolation process may be optionally performed, which in the example of FIG. 3 is used to increase the sampling rate of the composite signal $c(n)$ by a factor of two (2), and thereby transition from the second clock domain (e.g., a 1638.4 MHz clock domain) to a third clock domain (e.g., a 3276.8 MHz clock domain). After signal processing by the DUC 302, the composite signal $c(n)$ is provided as an input to a DPD system 304, which is described in more detail below. In some embodiments, the output of the DPD system 304 may undergo complex-to-real signal conversion 306, with the output of the complex-to-real signal conversion 306 provided as input to a DAC (e.g., which may be the DAC 204 of FIG. 2). In addition, one or more components of the DFE system 300 may be implemented in a programmable logic device, such as the programmable logic device of FIG. 1.

As previously discussed, the DPD process, and thus the DPD system 304, functions with the knowledge of the type of non-linearity 'x' that the CATV amplifier has, and with the knowledge of the signal chain between the baseband and DFE chip 202 and the CATV amplifiers 212, so that the DPD system 304 may effectively implement appropriate DPD processes (e.g., including adding the proper inverse non-linearity '1/x'). For example, the DPD system 304 may be used to model the CATV amplifier (e.g., including non-linear effects and the signal chain). As such, the models provided by the DPD system 304 may be generated and/or updated based on feedback data 308, where the feedback data 308 may include an output signal of a CATV amplifier (e.g., such as the CATV amplifier 212). In some embodiments, the feedback data 308 is processed through an analog-to-digital converter (ADC) 310 and provided to a DPD adaptation engine 312 as digital feedback data 311. In various examples, and based on the digital feedback data 311, the DPD adaptation engine 312 updates the DPD system 304 so that the DPD system 304 may adapt to the runtime behavior of the CATV amplifier. More specifically, in some embodiments, the DPD adaptation engine 312 may determine coefficients of filters or configuration of other elements within the DPD system 304, and generally may configure DPD modules, discussed below, within the DPD system 304. Thus, by continuously monitoring and updating the models provided by the DPD system 304 (e.g., via the feedback data 308 and the DPD adaptation engine 312), optimal DPD processes may be implemented. By way of example, aspects of monitoring and updating the models (e.g., such as functionality of the DPD adaptation engine 312) may be implemented as software stored in memory (e.g., within BRAMs 103, or within another on-chip memory location) and executed by one or more on-chip processors (e.g., PROC 110). It is noted that in some embodiments, the baseband and DFE chip 202, the DAC 204, and the ADC 310 may be implemented as a single chip (e.g., as in an RFSoC device). The example of monitoring and updating the models provided above is not meant to be limiting in any way, and it will be understood that while other methods are possible, the embodiments of the present disclosure are not limited by any of the examples provided.

As previously discussed, and in accordance with various embodiments, the DPD process described herein takes into account the baseband non-linear mirror image component. Elaborating on this concept, consider a CATV amplifier (e.g., such as the CATV amplifiers 212 of FIG. 2) having an input x(t) and an output y(t), where y(t)=$g_1$x(t)+$g_2$x$^2$(t)+$g_3$x$^3$(t)+ . . . . In some examples, 'g' may include a constant. More particularly, a non-linear model of the CATV amplifier may written as follows:

$$x^n = \left[\frac{1}{2}(\tilde{x} + \tilde{x}^*)\right]^n = \left(\frac{1}{2}\right)^n \sum_{m=0}^{n} C_n^m \tilde{x}^m \tilde{x}^{*n-m} \to \tilde{x}|\tilde{x}|^{2k}, \tilde{x}^*|\tilde{x}|^{2k},$$

where x is real and $\tilde{x}$ is its corresponding complex. Also, the conjugate of x is denoted as $\tilde{x}^*$. By way of example, the non-linear term $\tilde{x}|\tilde{x}|^{2k}$ may be the baseband model used in DPD for wireless communications, while its mirror image term $\tilde{x}^*|\tilde{x}|^{2k}$ is neglected because the wireless carrier frequencies are far away from DC (e.g., far away from the low frequency spectrum of the transmitted signal). As such, for wireless communications, there is no spectrum cross overlap between $\tilde{x}|\tilde{x}|^{2k}$ and $\tilde{x}^*|\tilde{x}|^{2k}$ in RF. For CATV amplifier applications, there is spectrum cross overlap in the frequency domain between $\tilde{x}|\tilde{x}|^{2k}$ and $\tilde{x}^*|\tilde{x}|^{2k}$. For instance, with reference to the example of FIG. 6A, illustrated therein is a spectrum 600 exhibiting a spectrum cross overlap 605. In order to more clearly show the spectrum cross overlap 605, the spectrum 600 simply illustrates portions of carrier signals (e.g., in contrast to spectrums shown in FIGS. 5A/5B). In particular, the spectrum 600 includes components 602 corresponding to the non-linear term $\tilde{x}^*|\tilde{x}|^{2k}$, as well as components 604 corresponding to the mirror image term $\tilde{x}^*|\tilde{x}|^{2k}$. In some cases, the mirror image term $\tilde{x}^*|\tilde{x}|^{2k}$ components 604 will move into the positive frequency domain (e.g., the spectrum cross overlap 605) and appear within the low frequency carrier(s) of the DOCSIS 3.1 waveform. In accordance with the various embodiments, such mirror image term components 604 appearing in the low frequency carrier(s) are added to the DPD data path, as discussed below.

Figure 4A:
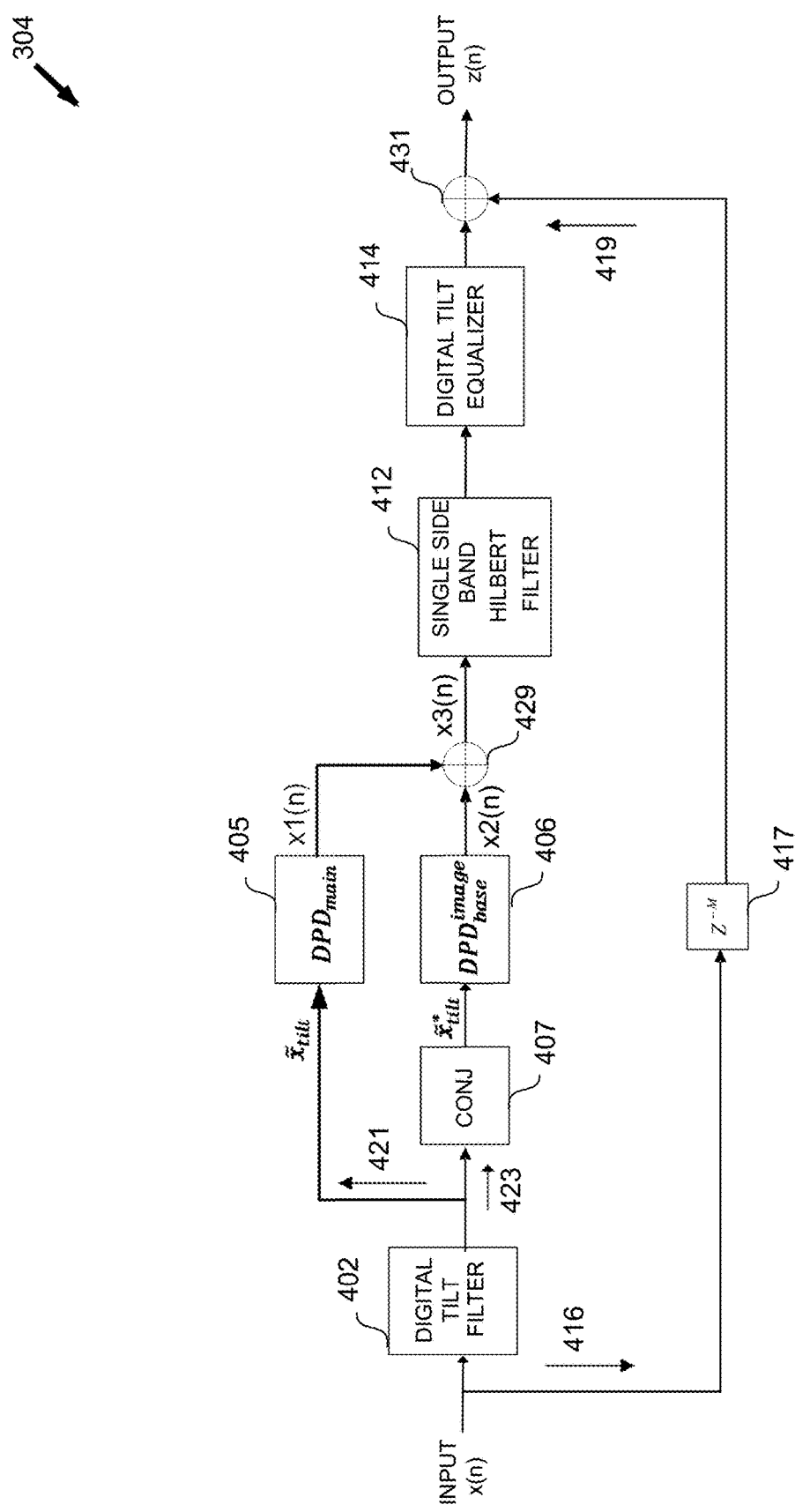
FIG. 4A provides a diagram of a digital predistortion (DPD) system, according to some embodiments.

With reference now to FIG. 4A, illustrated therein is a more detailed view of the DPD system 304, described above, that is used to implement various aspects of the present disclosure. As noted above, the DPD system 304 may be used to model the non-linear effects of the CATV amplifier (e.g., such as baseband non-linear mirror image components, as well as baseband and harmonic non-linear components). As such, the models provided by the DPD system 304 may be generated and/or updated based on feedback data (e.g., such as the feedback data 308), where the feedback data may include an output signal of a CATV amplifier processed through an ADC (e.g., such as the ADC 310) and provided to the DPD adaptation engine 312 so that the DPD system 304 may adapt to the non-linear behavior of the CATV amplifier. Thus, the DPD system 304 models of the non-linear effects of the CATV amplifier may be used to implement the various features of the DPD system 304 such as a digital tilt filter 402, a non-linear datapath 405, a non-linear datapath 406, a single side band Hilbert filter 412, and a digital tilt equalizer 414. It is noted that one or more components of the DPD system 304 may be implemented in a programmable logic device, such as the programmable logic device of FIG. 1.

Still with reference to FIG. 4A, the functionality of the DPD system 304 is described in more detail. For example, in some embodiments, a DPD input signal x(n), which may include the composite signal c(n) discussed above, is provided to the digital tilt filter 402. In some embodiments, the DPD input signal x(n) is a complex signal and may include the complex signal $\tilde{x}$, discussed above. In various cases, the digital tilt filter 402 may be used to model the analog tilt filter 208 (FIG. 2). Thus, by way of example, the output of the digital tilt filter 402 may be similar to the output of the analog tilt filter 208. In some embodiments, the output of the digital tilt filter 402, which may be denoted as $\tilde{x}_{tilt}$, is provided along a datapath 421 as an input to the non-linear datapath 405 and along a datapath 423 as an input to conjugation block 407. In some embodiments, the conjugation block 407 conjugates the incoming signal and thus provides the conjugate signal, which may be denoted as $\tilde{x}_{tilt}^*$, to the non-linear datapath 406. Generally, in various embodiments, the non-linear datapath 405 is denoted as $DPD_{main}$, which includes a baseband DPD datapath denoted as $$DPD_{base} \sim \sum_{k=0}^{P} B_k \tilde{x}_{tilt}|\tilde{x}_{tilt}|^k,$$

a video bandwidth DPD data path denoted as $$DPD_{VB} \sim \sum_{k=1}^{P/2} C_k |\tilde{x}_{tilt}|^{2k},$$

a 2$^{nd}$ harmonics DPD data path denoted as $$DPD_{2ndH} \sim \sum_{k=1}^{P/2} D_k \tilde{x}_{tilt}^2 |\tilde{x}_{tilt}|^{2(k-1)},$$

and a 3$^{rd}$ harmonics DPD data path denoted as $$DPD_{3rdH} \sim \sum_{k=1}^{(P-1)/2} E_k \tilde{x}_{tilt}^3 |\tilde{x}_{tilt}|^{2(k-1)}.$$

In contrast, the non-linear data path 406 is denoted as $$DPD_{base}^{image} \sim \sum_{k=1}^{P} F_k \tilde{x}_{tilt}^* |\tilde{x}_{tilt}|^k.$$

Coefficients $B_k$, $C_k$, $D_k$, $E_k$ and $F_k$ are DPD adapted coefficients. Thus, the non-linear data path 405 may provide the main non-linear components, and the non-linear data path 406 may provide baseband non-linear mirror image components to the DPD data path.

Figure 4B:
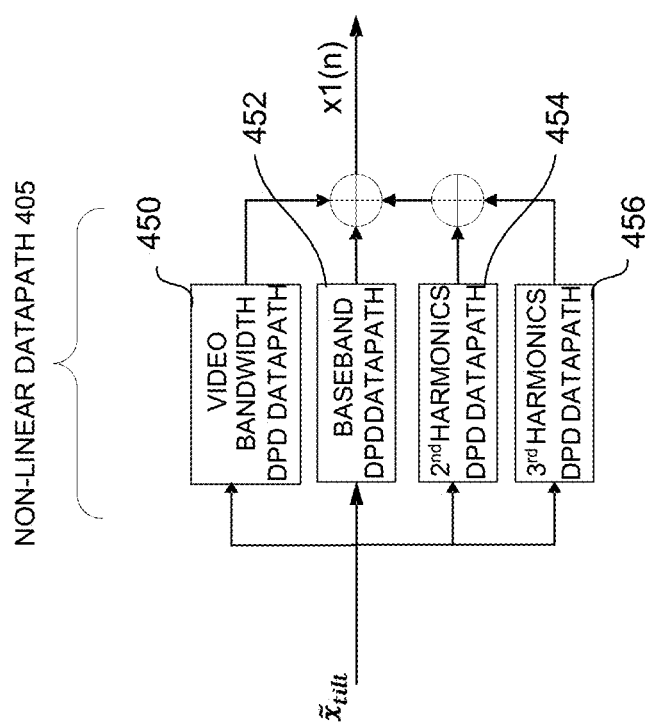
FIGS. 4B and 4C provide examples of non-linear datapaths, according to some embodiments.
Figure 4C:
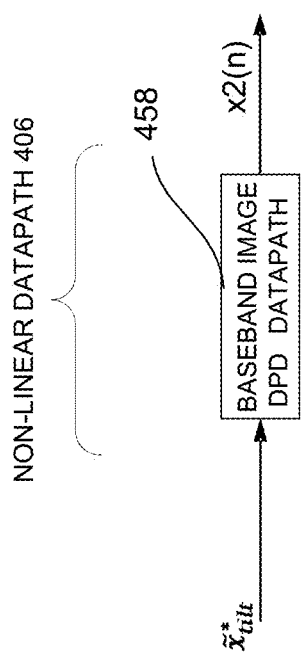

By way of example, with reference to FIGS. 4B and 4C, illustrated therein are exemplary datapaths for the non-linear datapath 405 and the non-linear datapath 406, respectively. The non-linear datapath 405, which operates on the signal $\tilde{x}_{tilt}$, may include a plurality of different parallel datapath elements including a video bandwidth DPD datapath 450, a baseband DPD datapath 452, a $2^{nd}$ harmonics DPD datapath 454, and a $3^{rd}$ harmonics DPD datapath 456. The non-linear datapath 406, operates on the conjugate signal $\tilde{x}_{tilt}^*$, may include a baseband image DPD datapath 458. In general, the non-linear datapaths 405, 406 may be used to model and add the inverse non-linear behavior of the CATV amplifier to the incoming signal. More particularly, each of the different parallel datapath elements of the non-linear datapath 405, and the baseband image DPD datapath 458 of the non-linear datapath 406, may be used to model and add a different aspect of the inverse non-linear behavior of the CATV amplifier to the incoming signal (e.g., the signal $\tilde{x}_{tilt}$ or the conjugate signal $\tilde{x}_{tilt}^*$).

For example, with respect to the non-linear datapath 405 operating on the signal $\tilde{x}_{tilt}$, the video bandwidth DPD datapath 450 may model and add an inverse non-linear video bandwidth component, the baseband DPD datapath 452 may model and add an inverse non-linear baseband component, the $2^{nd}$ harmonics DPD datapath 454 may model and add an inverse $2^{nd}$ harmonics component, and the $3^{rd}$ harmonics DPD datapath 456 may model and add an inverse $3^{rd}$ harmonics component. As shown, the output of each of the video bandwidth DPD datapath 450, the baseband DPD datapath 452, the $2^{nd}$ harmonics DPD datapath 454, and the $3^{rd}$ harmonics DPD datapath 456 are then combined to provide a composite signal $x1(n)$ that models the baseband, video, and harmonic components of the CATV amplifier. With respect to the non-linear datapath 406 operating on the conjugate signal $\tilde{x}_{tilt}^*$, the baseband image DPD datapath 458 may model and add an inverse non-linear baseband mirror image component. Thus, the output of the non-linear datapath 406 provides a signal $x2(n)$ that models the baseband non-linear mirror image components of the CATV amplifier.

Returning to FIG. 4A, the output of the non-linear datapath 405 ($x1(n)$) and the output of the non-linear datapath 406 ($x2(n)$) are combined by a combiner 429, resulting in a signal $x3(n)$. Thereafter, the signal $x3(n)$ is provided as an input to the single side band Hilbert filter 412, which may be used to further modulate the signal $x3(n)$. Merely for purposes of illustration, consider that the signal $x3(n)$ includes the spectrum 600 (FIG. 6A) that includes the mirror image components 604. In some embodiments, and after processing by the single side band Hilbert filter 412, the spectrum 600 may become a spectrum 650, as shown in FIG. 6B. Thus, the single side band Hilbert filter 412 may serve to remove signal components within a negative frequency domain, while preserving the mirror image component(s) appearing within low frequencies of the positive frequency domain (e.g., the spectrum cross overlap 605). In various embodiments, the output of the single side band Hilbert filter 412 is then provided as an input to the digital tilt equalizer 414 (FIG. 4A). By way of example, the digital tilt equalizer 414 may be used to model and add the inverse of the analog tilt filter 208 (FIG. 2) to the incoming signal. Thus, by way of example, the output of the digital tilt equalizer 414 may not be affected by (e.g., or may cancel) the effect of the analog tilt filter 208. As shown in FIG. 4A, in some embodiments, the input signal x(n), is also transmitted along a path 416, where the path 416 is a linear datapath. In some examples, the datapath 416 may merely introduce a time delay in the input signal x(n) (e.g., at block 417). Moreover, the input signal x(n) transmitted along the datapath 416 bypasses the digital tilt filter 402, the non-linear datapath 405, the non-linear datapath 406, the conjugation block 407, the single side band Hilbert filter 412 and the digital tilt equalizer 414. As such, the quality of the signal modulation of the input signal x(n) transmitted along the datapath 416 will remain unaffected by the other elements of the DPD system 304. In addition, as shown in FIG. 4A, the output of the digital tilt equalizer 414 and the time-delayed input signal x(n) 419 are combined by a combiner 431 to provide an output signal z(n). In some embodiments, the output signal z(n) includes a complex signal. Referring to FIGS. 2, 3, and 4A, the output of the DPD system 304, z(n), may be converted to a real signal (FIG. 3, block 306) and further processed by the RF DAC 204 and the analog tilt filter 208 before being provided to the CATV amplifiers 212.

Figure 5A:
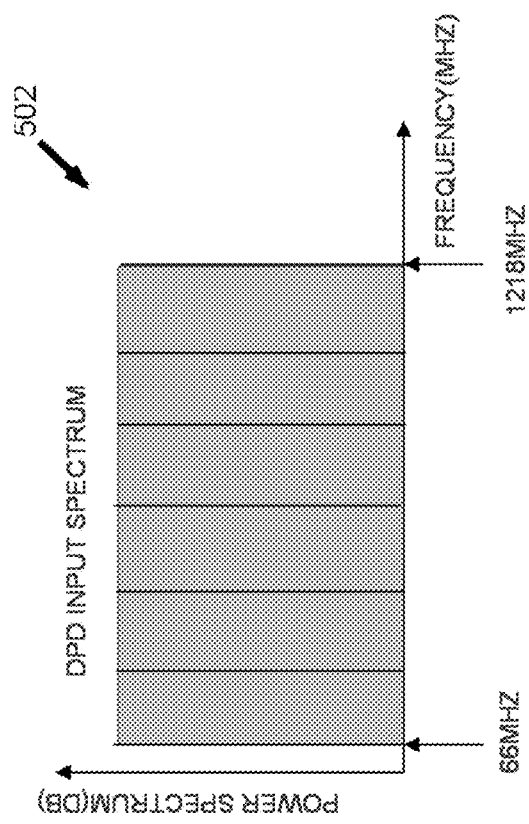
FIGS. 5A and 5B provide an exemplary DPD input spectrum and DPD output spectrum, respectively, in accordance with some embodiments.
Figure 5B:
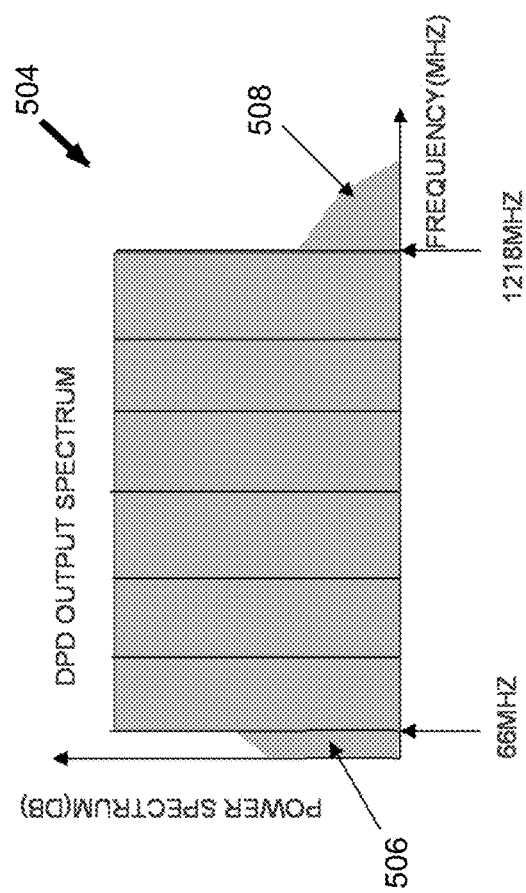

With reference now to FIG. 5A, an exemplary DPD input spectrum 502 is provided. In some embodiments, the DPD input signal x(n) (FIG. 4A) may include the DPD input spectrum 502. As noted above, the DPD input spectrum 502 may include each of a plurality of different carriers mixed at different frequencies (e.g., by the DUC 302), as previously described, where each of the plurality of different carriers are arranged side-by-side in frequency across a full-bandwidth from about 66 MHz to about 1218 MHz. Referring to FIG. 5B, an exemplary DPD output spectrum 504 is provided. In some embodiments, the DPD output signal z(n) (FIG. 4A) may include the DPD output spectrum 504. As shown in FIG. 5B, the DPD output spectrum 504 includes one or more non-linear components 506, 508 that have been added to the signal by the DPD system 304. In at least some examples, the one or more non-linear components 506 (e.g., the low-frequency components) may include mirror image components, as described above. As a result of processing performed by the DPD system 304, CATV amplifier efficiency and signal quality are improved, and power consumption is reduced.

Figure 7:
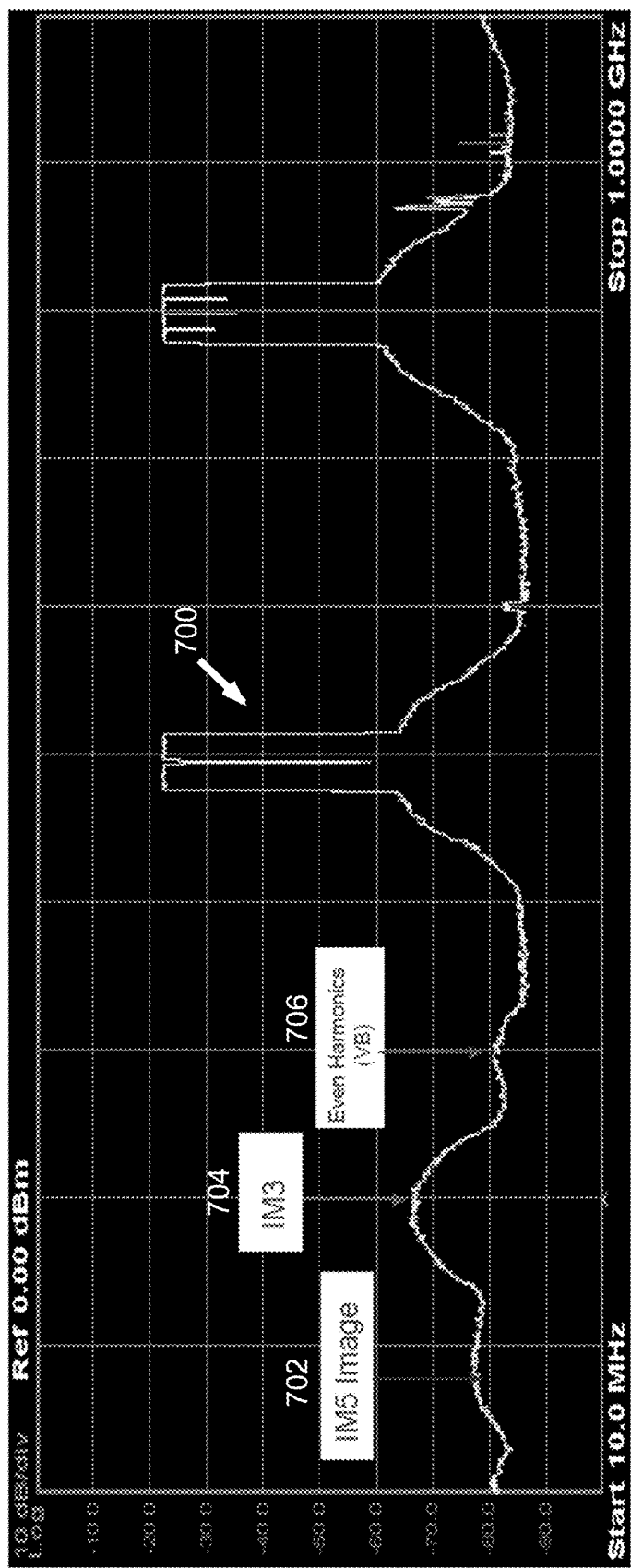
FIG. 7 illustrates a power spectrum that shows the non-linear effects of a CATV amplifier, according to some embodiments.
Figure 8:
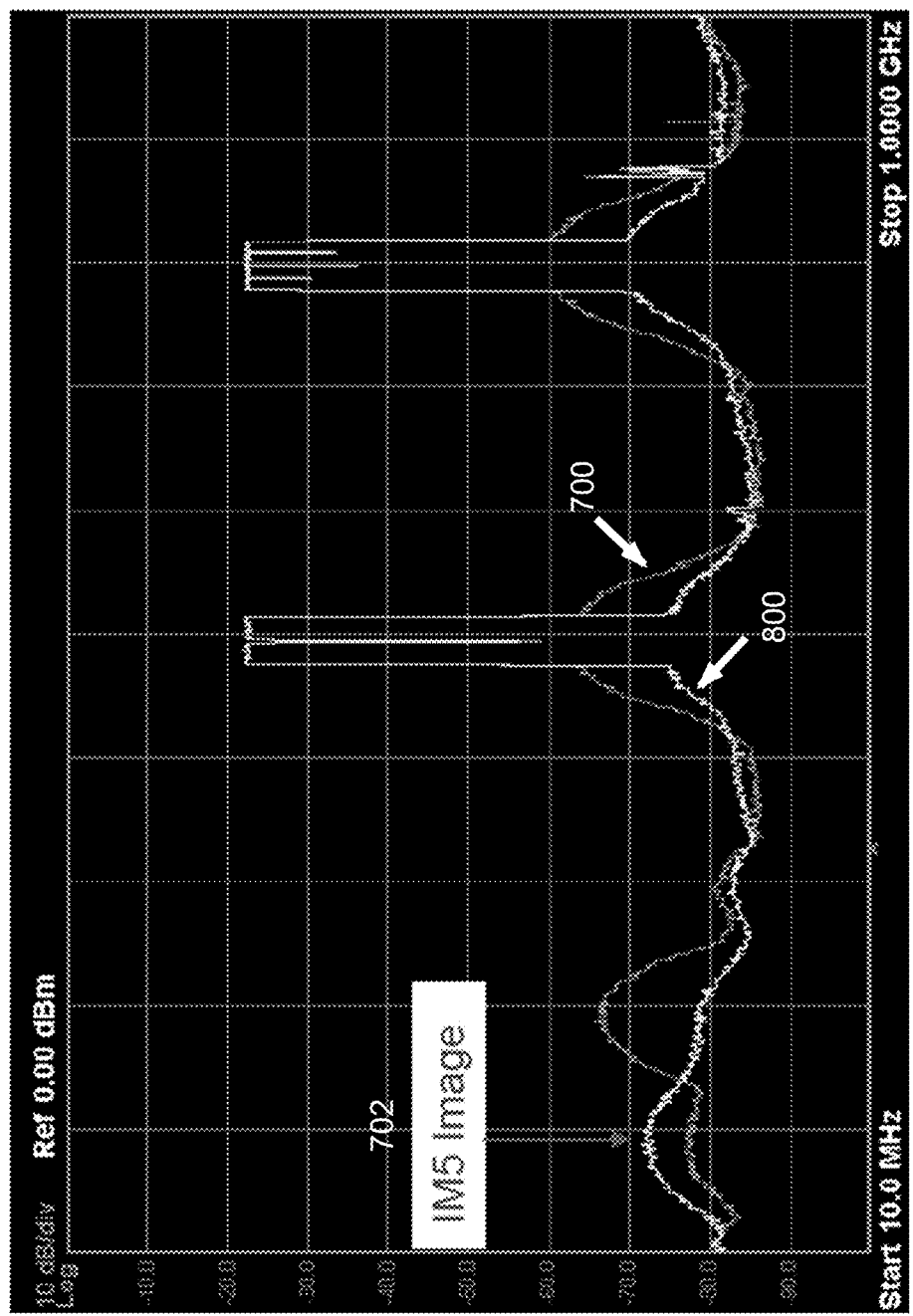
FIG. 8 illustrates a power spectrum showing the result of applying a DPD correction, without including a mirror image component, to the power spectrum of FIG. 7, according to some embodiments.
Figure 9:
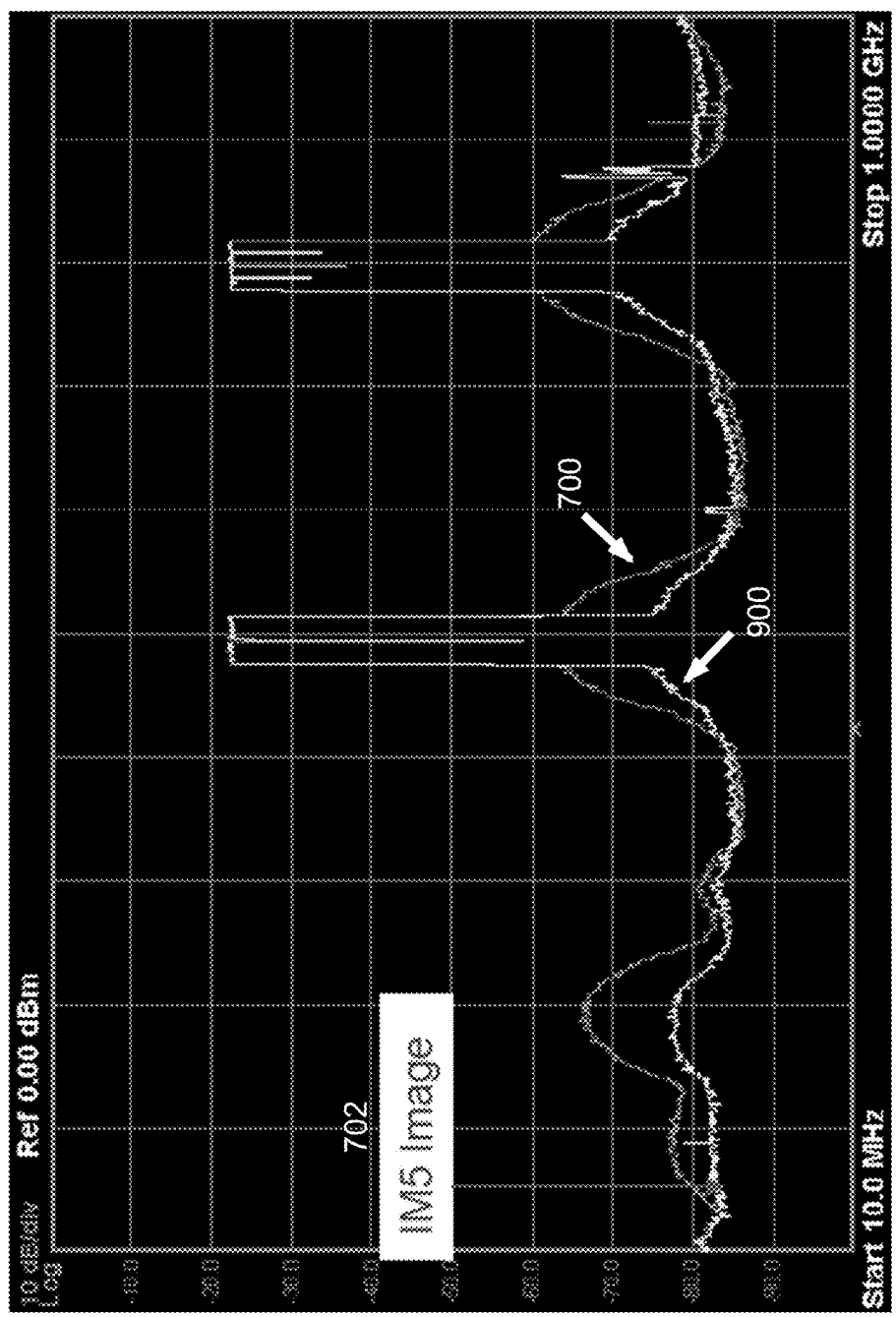
FIG. 9 illustrates a power spectrum showing the result of applying a DPD correction, including a mirror image component, to the power spectrum of FIG. 7, according to some embodiments.

Referring now to FIGS. 7-10, shown therein is a plurality of data that illustrates at least some of the benefits and advantages of the various embodiments of the present disclosure. Referring first to FIG. 7, illustrated therein is a power spectrum 700 for a subset of carriers that shows the non-linear effects of a CATV amplifier. The power spectrum 700, and the power spectrums of FIGS. 8-9, are generated with a spectrum analyzer using a resolution bandwidth of 100 kHz and a video bandwidth of 10 kHz. In some embodiments, the waveform illustrated for the power spectrum 700 is a 4K QAM DOCSIS 3.1 waveform. In various embodiments, the power spectrum 700 may generally include non-linear baseband components, non-linear video bandwidth components, $2^{nd}$ harmonics components, $3^{rd}$ harmonics components, mirror image components, and/or other components. In particular, and for purposes of this discussion, FIG. 7 illustrates a $5^{th}$ order intermodulation (IM5) component 702, a $3^{rd}$ order intermodulation (IM3) component 704, and an even harmonics component 706. In some embodiments, the IM5 component 702 includes the mirror image component, discussed above. In various embodiments, the IM5 component 702 may include both signal portions that are natively present in the positive frequency region, as well as those mirror image components that have folded back from DC into the positive frequency region (e.g., similar to the spectrum cross overlap 605 of FIGS.

6A/6B where mirror image components move into the positive frequency domain). As mentioned above, the power spectrum 700 is for a subset of carriers. However, consider having a plurality of different carriers arranged side-by-side in frequency, as previously discussed (e.g., as in FIG. 5A). In such a case, the non-linear components of the power spectrum 700 would certainly affect and degrade the power spectrum of neighboring carriers.

Referring now to FIG. 8, illustrated therein is the power spectrum 700 (including the non-linear effects of a CATV amplifier) and a power spectrum 800 superimposed over the power spectrum 700, showing the result of applying a baseband DPD correction without including the mirror image component. Stated another way, the power spectrum 800 illustrates the partially beneficial effect (e.g., at the output of the CATV amplifier) of applying a baseband DPD correction without including the mirror image component (e.g., by using only the non-linear datapath 405 of FIG. 4A). Such a process may improve the non-linear components of the power spectrum 700 (e.g., the IM3 component 704 is reduced). However, the IM5 component 702 (mirror image component) is not removed and thus should still be addressed.

FIG. 9 illustrates the power spectrum 700 (including the non-linear effects of a CATV amplifier) and a power spectrum 900 superimposed over the power spectrum 700, showing the result of applying a baseband DPD correction including the mirror image component. Stated another way, the power spectrum 900 illustrates the beneficial effect (e.g., at the output of the CATV amplifier) of applying a baseband DPD correction while including the mirror image component (e.g., by using at least the non-linear datapath 406 and optionally the non-linear datapath 405 of FIG. 4A). Such a process further improves the non-linear components of the power spectrum 700 and is able to substantially correct (remove) the IM5 component 702.

As discussed above, the mirror image component (e.g., such as the IM5 component 702) may degrade the modulation error ratio (MER) for a CATV amplifier. In particular, to achieve the high MER specification for DOCSIS 3.1 of up to 41 dB for a 4K QAM signal, the mirror image component (e.g., such as the IM5 component 702) should be corrected (removed). With reference to FIG. 10, illustrated therein is a table including MER data for a CATV amplifier showing the effect of applying the corrections provided by the DPD system 304 on the MER data. By way of example, MER is a measure used to quantify the performance of a digital radio (or digital TV) transmitter or receiver in a communications system using digital modulation (such as QAM). For the example of FIG. 10, the table includes MER data for a first CATV amplifier 1002 and a second CATV amplifier 1004. With reference first to the data for the CATV amplifier 1002, the CATV amplifier under test is operable at 34V/380 mA and has an output power of 76.8 dbmV/750. To compare the MER data to cable industry specifications: MER=41 dB, 4KQAM, 76.8 dbmV/750. The first CATV amplifier is tested using a 4K QAM signal with a carrier frequency of 204 MHz. In a first test, where the first CATV amplifier is operated without DPD corrections, MER=35.15 dB and the 204 MHz carrier does not meet industry specifications. In a second test, with DPD corrections applied but without including the mirror image component, MER=38.69 dB and the 204 MHz carrier still does not meet industry specifications. In a third test, with DPD corrections applied and including the mirror image component (e.g., including the non-linear datapath 406 of FIG. 4A), MER=41.35 dB and the 204 MHz carrier meets industry specifications. Referring now to the data for the CATV amplifier 1004, the CATV amplifier under test is operable at 34V/400 mA and has an output power of 76.8 dbmV/750. The second CATV amplifier is also tested using a 4K QAM signal with a carrier frequency of 204 MHz. In a first test, where the second CATV amplifier is operated without DPD corrections, MER=36.32 dB and the 204 MHz carrier does not meet industry specifications. In a second test, with DPD corrections applied but without including the mirror image component, MER=38.79 dB and the 204 MHz carrier still does not meet industry specifications. In a third test, with DPD corrections applied and including the mirror image component (e.g., including the non-linear datapath 406 of FIG. 4A), MER=41.54 dB and the 204 MHz carrier meets industry specifications.

Figure 11:
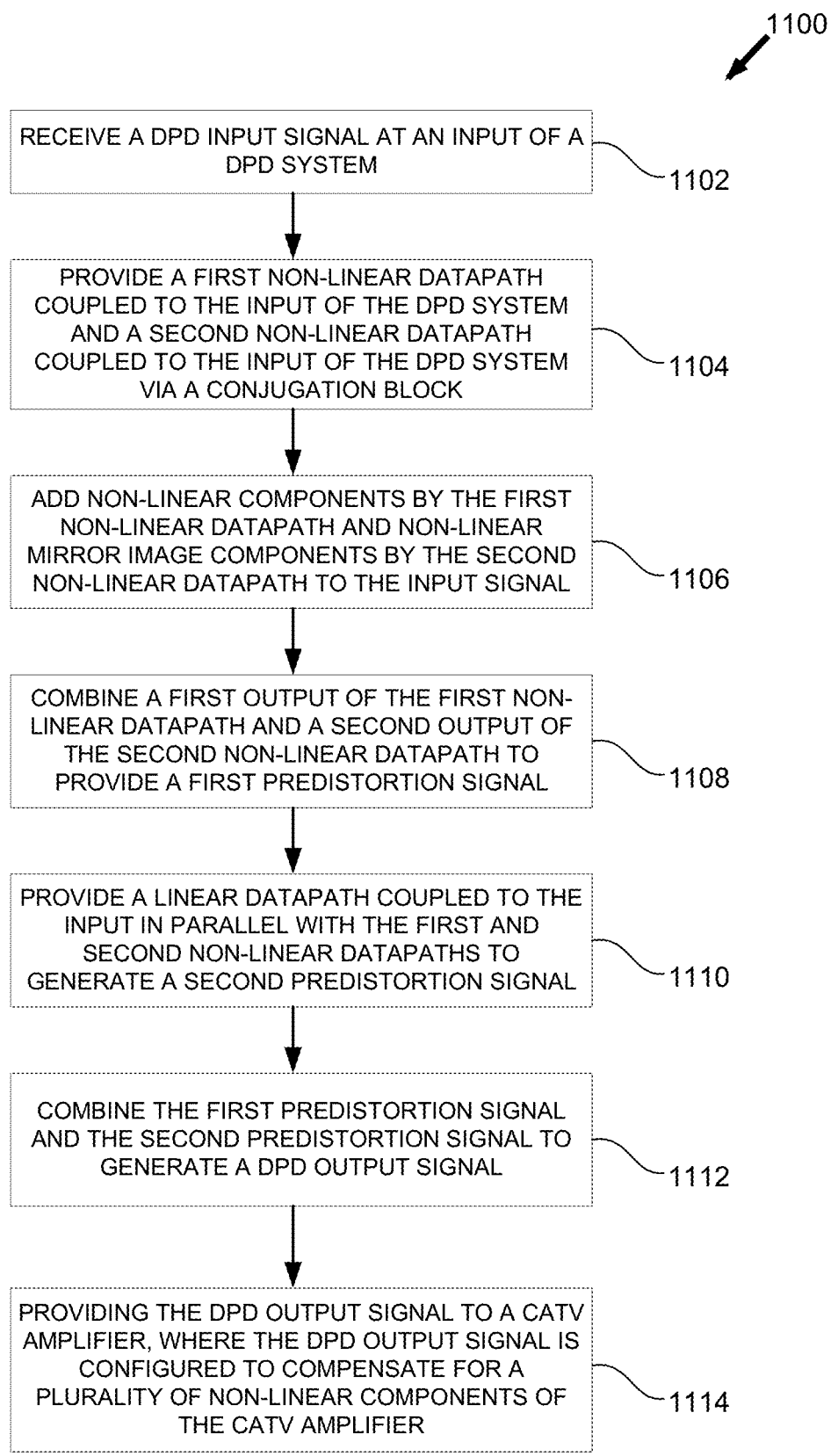
FIG. 11 is a flow diagram illustrating a method for performing a digital predistortion process in a DPD system, according to some embodiments.

Referring now to FIG. 11, illustrated therein is a method 1100 for performing a digital predistortion process in a DPD system, in accordance with various embodiments. The method 100 begins at block 1102 where a DPD input signal is received at an input of a DPD system, such as the DPD system 304 of FIG. 4A. As discussed above, and in some embodiments, the DPD input signal may include the DPD input signal x(n) (FIG. 4A), which may further include the composite signal c(n) generated by the DUC 302 (FIG. 3). In some examples, the method 1100 proceeds to block 1104 where a first non-linear datapath coupled to the input of the DPD system is provided (e.g., the non-linear datapath 405 of FIG. 4A), and where a second non-linear datapath coupled to the input of the DPD system via a conjugation block is also provided (e.g., the non-linear datapath 406 receiving the output of the conjugation block 407). In some embodiments, the method 1100 proceeds to block 1106 where non-linear components are added to the input signal using the first non-linear datapath (e.g., the non-linear datapath 405) to generate a first non-linear signal (x1($n$)), and where non-linear mirror image components are added to the input signal using the second non-linear datapath (e.g., the non-linear datapath 406) to generate a second non-linear signal (x2($n$)). In some examples, the method 1100 proceeds to block 1108 where the first non-linear signal (x1($n$)) and the second non-linear signal (x2($n$)) are combined to provide a first predistortion signal (x3($n$)). In some embodiments, the method 1100 proceeds to block 1110 where a linear datapath coupled to the input in parallel with the non-linear datapaths 405, 406 is provided, and where the linear datapath generates a second predistortion signal. In some embodiments, the second predistortion signal may include the time-delayed DPD input signal x(n) 419 (FIG. 4A). The method 1100 then proceeds to block 1112 where the first predistortion signal and the second predistortion signal are combined to generate a DPD output signal. In some embodiments, the DPD output signal may include the DPD output signal z(n) (FIG. 4A). In various embodiments, the method 1100 proceeds to block 1114 where the DPD output signal is provided to a CATV amplifier (e.g., such as the CATV amplifiers 212 of FIG. 2). In accordance with embodiments of the present disclosure, the DPD output signal is configured to compensate for a plurality of non-linear components, including non-linear mirror image components, of the CATV amplifier. It will be understood that additional method steps may be implemented before, during, and after the method 1100, and some method steps described above may be replaced or eliminated in accordance with various embodiments of the method 1100, without departing from the scope of the present disclosure.

It is noted that various configurations (e.g., the components of the cable network 200, the DFE system 300, and the DPD system 304, the number of parallel datapath elements in FIG. 4B, as well as other features and components illustrated in the figures) are exemplary only and not intended to be limiting beyond what is specifically recited in the claims that follow. It will be understood by those skilled in the art that other configurations may be used. Also, while an exemplary cable network 200 is illustrated, the DPD system disclosed herein may be used to in other communication systems, for example where the other communication systems deploy an amplifier exhibiting detrimental non-linear behavior.

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A digital predistortion (DPD) system, comprising:
   an input configured to receive a DPD input signal;
   a first non-linear datapath coupled to the input, wherein the first non-linear datapath is configured to add a non-linear mirror image component to the DPD input signal to provide a first non-linear signal that is used to generate a first predistortion signal;
   a linear datapath coupled to the input in parallel with the first non-linear datapath to generate a second predistortion signal; and
   a first combiner configured to combine the first predistortion signal and the second predistortion signal to generate a DPD output signal.

2. The DPD system of claim 1, further comprising:
   a second non-linear datapath coupled to the input, wherein the second non-linear datapath is configured to add a non-linear component to the DPD input signal to generate a second non-linear signal; and
   a second combiner configured to combine the first non-linear signal and the second non-linear signal to generate the first predistortion signal.

3. The DPD system of claim 1, further comprising:
   a conjugation block coupled to the input and configured to conjugate the DPD input signal to provide a conjugate DPD input signal at an output of the conjugation block, wherein the first non-linear datapath is coupled to the output of the conjugation block and configured to receive the conjugate DPD input signal.

4. The DPD system of claim 1, wherein the non-linear mirror image component includes a spectrum cross overlap component.

5. The DPD system of claim 1, wherein the non-linear mirror image component includes a baseband non-linear mirror image component.

6. The DPD system of claim 2, wherein the non-linear component includes a baseband non-linear component and a harmonic non-linear component.

7. The DPD system of claim 1, wherein the DPD input signal includes a first complex signal, and wherein the DPD output signal includes a second complex signal including the non-linear mirror image component.

8. The DPD system of claim 2, wherein the second non-linear datapath includes a plurality of parallel datapath elements each coupled to the input, wherein each of the plurality of parallel datapath elements is configured to add a different inverse non-linear component to the DPD input signal corresponding to a non-linear component of an amplifier, and wherein a third combiner is configured to combine an output of each of the plurality of parallel datapath elements to generate the second non-linear signal.

9. The DPD system of claim 1, further comprising:
   a digital tilt filter configured to model an analog tilt filter, wherein a digital tilt filter input is coupled to the input, and wherein a digital tilt filter output is coupled to the first non-linear datapath.

10. The DPD system of claim 1, further comprising:
    a digital tilt equalizer configured to model an inverse of an analog tilt filter, wherein a digital tilt equalizer input is configured to receive the first predistortion signal, and wherein the first combiner is configured to combine a digital tilt equalizer output to the second predistortion signal to generate the DPD output signal.

11. The DPD system of claim 10, further comprising:
    a single side band Hilbert filter, wherein a single side band Hilbert filter input is configured to receive the first predistortion signal, and wherein a single side band Hilbert filter output is coupled to the digital tilt equalizer input.

12. The DPD system of claim 1, wherein the DPD output signal is coupled to an amplifier input to generate an amplified output signal, and
    wherein the DPD output signal is configured to compensate for a plurality of non-linear components, including non-linear mirror image components, of the amplifier.

13. The DPD system of claim 1, wherein the DPD input signal includes a composite signal generated by a digital upconverter (DUC).

14. The DPD system of claim 13, wherein the DUC is configured to generate the composite signal upon receipt and translation of a baseband data input signal.

15. The DPD system of claim 12, wherein a DPD system configuration is configured to be updated by a DPD adaptation module, and wherein the DPD adaptation module configured to receive the amplified output signal.

16. The DPD system of claim 15, wherein a signal path between the amplifier and the DPD adaptation module is filter-free.

17. A method, comprising:
    receiving a DPD input signal at an input of a digital predistortion (DPD) system;
    receiving the DPD input signal at a first non-linear datapath coupled to the input of the DPD system;
    adding, by the first non-linear datapath, a non-linear mirror image component to the DPD input signal to provide a first non-linear signal that is used to generate a first predistortion signal;
    receiving the DPD input signal at a linear datapath coupled to the input in parallel with the first non-linear datapath to generate a second predistortion signal; and
    combining, by a first combiner, the first predistortion signal and the second predistortion signal to generate a DPD output signal.

18. The method of claim 17, further comprising:
    receiving the DPD input signal at a second non-linear datapath coupled to the input of the DPD system;
    adding, by the second non-linear datapath, a non-linear component to the DPD input signal to provide a second non-linear signal; and
    combining, by a second combiner, the first non-linear signal and the second non-linear signal to generate the first predistortion signal.

19. The method of claim 18, wherein the non-linear mirror image component includes a baseband non-linear mirror image component, and wherein the non-linear component includes a baseband non-linear component and a harmonic non-linear component.

20. The method of claim 17, further comprising:
providing the DPD output signal to an amplifier input to generate an amplified output signal, wherein the DPD output signal is configured to compensate for a plurality of non-linear components, including non-linear mirror image components, of the amplifier.

* * * * *